United States Patent
Gao et al.

(10) Patent No.: US 10,784,213 B2
(45) Date of Patent: Sep. 22, 2020

(54) POWER DEVICE PACKAGE

(71) Applicant: Hong Kong Applied Science and Technology Research Institute Company Limited, Hong Kong (CN)

(72) Inventors: Ziyang Gao, Hong Kong (CN); Shek Mong Wong, Hong Kong (CN); Tak Lok Shum, Hong Kong (CN)

(73) Assignee: Hong Kong Applied Science and Technology Research Institute Company Limited, Hong Kong (CN)

( * ) Notice: Subject to any disclaimer, the term of this patent is extended or adjusted under 35 U.S.C. 154(b) by 72 days.

(21) Appl. No.: 15/880,565

(22) Filed: Jan. 26, 2018

(65) Prior Publication Data

US 2019/0237416 A1    Aug. 1, 2019

(51) Int. Cl.
*H01L 23/00* (2006.01)
*H01L 23/64* (2006.01)
(Continued)

(52) U.S. Cl.
CPC ............ *H01L 23/645* (2013.01); *H01L 23/34* (2013.01); *H01L 23/3675* (2013.01);
(Continued)

(58) Field of Classification Search
CPC ......... H01L 24/16; H01L 24/18; H01L 24/20; H01L 24/24; H01L 24/80–85; H01L 24/94–97; H01L 24/36; H01L 24/40; H01L 24/66; H01L 23/3675; H01L 23/34; H01L 23/49816; H01L 23/49822; H01L 23/49844; H01L 23/645; H01L 27/0255; H01L 27/283; H01L 27/228; H01L 28/10;
(Continued)

(56) References Cited

U.S. PATENT DOCUMENTS 5,831,333 A * 11/1998 Malladi ................... H01L 23/34
                                                                            257/12
6,642,064 B1 * 11/2003 Terrill ................... H01L 23/5382
                                                                        257/E23.171
(Continued)

FOREIGN PATENT DOCUMENTS

| CN | 102646670 A | 8/2012 |
| CN | 104810299 A | 7/2015 |
| EP | 2991104 A2  | 3/2016 |

*Primary Examiner* — Natalia A Gondarenko
(74) *Attorney, Agent, or Firm* — Norton Rose Fulbright US LLP

(57) ABSTRACT

A power device package includes a substrate, a high side power device, a low side power device and a driver device. The substrate includes a top surface, a bottom surface and a plurality of vias that extend through the substrate. The high side and low side power devices are disposed on the top surface of the substrate and connected with each other. The driver device is disposed on the bottom surface of the substrate and electrically connected with the high side and low side power devices through the vias to drive the high side and low side power devices in response to a control signal. The distance between the driver device and the high side and low side power devices is determined by the thickness of the substrate such that that a parasitic inductance between the driver device and the high side power device or the low side power device is reduced.

14 Claims, 5 Drawing Sheets

(51) Int. Cl.
| | | |
|---|---|---|
| *H01L 23/34* | (2006.01) | |
| *H01L 23/367* | (2006.01) | |
| *H01L 23/498* | (2006.01) | |
| *H01L 25/07* | (2006.01) | |
| *H01L 27/02* | (2006.01) | |
| *H01L 29/20* | (2006.01) | |
| *H01L 29/778* | (2006.01) | |
| *H02M 7/00* | (2006.01) | |
| *H02M 1/00* | (2006.01) | |
| *H02M 1/088* | (2006.01) | |
| *H02M 3/335* | (2006.01) | |

(52) U.S. Cl.
CPC .. *H01L 23/49816* (2013.01); *H01L 23/49822* (2013.01); *H01L 23/49844* (2013.01); *H01L 24/16* (2013.01); *H01L 25/072* (2013.01); *H01L 27/0255* (2013.01); *H01L 29/2003* (2013.01); *H01L 29/7787* (2013.01); *H02M 7/003* (2013.01); *H01L 24/13* (2013.01); *H01L 24/29* (2013.01); *H01L 24/32* (2013.01); *H01L 24/33* (2013.01); *H01L 24/73* (2013.01); *H01L 2224/13013* (2013.01); *H01L 2224/13014* (2013.01); *H01L 2224/13101* (2013.01); *H01L 2224/16225* (2013.01); *H01L 2224/2919* (2013.01); *H01L 2224/32225* (2013.01); *H01L 2224/33181* (2013.01); *H01L 2224/73204* (2013.01); *H01L 2224/73253* (2013.01); *H01L 2924/1033* (2013.01); *H01L 2924/1306* (2013.01); *H01L 2924/13064* (2013.01); *H01L 2924/1426* (2013.01); *H01L 2924/14252* (2013.01); *H01L 2924/15311* (2013.01); *H01L 2924/16152* (2013.01); *H01L 2924/19041* (2013.01); *H01L 2924/19043* (2013.01); *H01L 2924/19103* (2013.01); *H01L 2924/19105* (2013.01); *H01L 2924/19106* (2013.01); *H01L 2924/30107* (2013.01); *H02M 1/088* (2013.01); *H02M 3/33592* (2013.01); *H02M 2001/0054* (2013.01); *H02M 2001/0058* (2013.01)

(58) Field of Classification Search
CPC ..... H01L 28/20; H01L 28/40; H01L 29/2003; H01L 29/7787; H01L 25/04; H01L 25/042; H01L 25/065; H01L 25/0652; H01L 25/0655; H01L 25/071; H01L 25/072; H01L 25/115; H01L 2924/13064; H01L 2924/19043; H01L 2924/19103; H01L 2924/1033; H01L 2924/1426; H01L 2924/19041; H01L 2924/30107; H01L 2924/14252; H01L 27/013; H01L 27/0218; H01L 27/0251; H01L 27/06; H01L 27/0617; H01L 27/0823; H01L 27/0826; H01L 27/085; H01L 27/088; H01L 29/66712; H01L 29/7802; H01L 29/7817; H01L 29/7827; H01L 2924/13081; H01L 2924/13091; H01L 2924/13055; H01L 2924/14; H01L 2924/1424; H01L 2924/1427; H01L 2924/15–15157; H01L 2924/1531; H01L 2224/37011; H01L 2224/40137; H01L 2224/40225; H01L 23/04; H01L 23/043; H01L 23/06; H01L 23/13; H01L 23/3114; H01L 23/4093; H01L 23/4821; H01L 23/50; H01L 23/522; H01L 23/5221; H01L 23/66; H01L 25/50; H01L 24/84; H02M 3/33592; H02M 2001/0054; H02M 1/088; H02M 7/003
USPC ......... 257/76, 669, 392, 288, 690, 685, 777, 257/723, 724, 699, 712, 713, 730, 731, 257/773, 732, 678
See application file for complete search history.

(56) References Cited

U.S. PATENT DOCUMENTS

| | | | |
|---|---|---|---|
| 7,078,788 B2* | 7/2006 | Vu | H01L 21/56 |
| | | | 174/521 |
| 7,145,224 B2 | 12/2006 | Kawashima et al. | |
| 7,514,774 B2 | 4/2009 | Leung et al. | |
| 8,203,321 B2 | 6/2012 | Liang et al. | |
| 8,581,416 B2 | 11/2013 | Massie et al. | |
| 9,159,703 B2 | 10/2015 | Cho et al. | |
| 9,214,416 B1* | 12/2015 | Furnival | H01L 23/49541 |
| 2003/0106924 A1* | 6/2003 | Nobori | H01L 23/492 |
| | | | 228/180.22 |
| 2005/0052888 A1* | 3/2005 | Takeshima | H02M 7/003 |
| | | | 363/147 |
| 2008/0023824 A1 | 1/2008 | Salzman | |
| 2010/0283116 A1* | 11/2010 | Shimizu | H01L 21/823481 |
| | | | 257/500 |
| 2012/0133427 A1* | 5/2012 | Kim | H01L 23/34 |
| | | | 327/564 |
| 2017/0047315 A1 | 2/2017 | Otremba et al. | |
| 2018/0182730 A1* | 6/2018 | Cho | H01L 23/492 |

* cited by examiner

US 10,784,213 B2

POWER DEVICE PACKAGE

FIELD OF THE INVENTION

The present invention relates to a power device package, and more particularly, to a power device package that includes power devices and a driver device vertically stacked beneath the power devices.

BACKGROUND

Power devices, such as power switches are used in power applications in telecommunication equipment, data centers, aerospace systems, and Radio Frequency systems. Semiconductor chips with power devices such as metal-oxide semiconductor field-effect transistors (MOSFETs) and insulated gate bipolar transistors (IGBTs) are built into packages with other electronic components or integrated circuits. The package for such power devices is required to meet stringent requirements to operate under high frequency and high current density. Further, the power device package serves to provide electrical interconnections, thermal dissipation, and mechanical support for the chips and other components housed inside.

In view of the demand for high power applications, power device packages having low parasitic parameters are desired in order to achieve high speed, low loss and high efficiency.

SUMMARY OF THE INVENTION

One example embodiment is a power device package that includes a substrate, a high side power device, a low side power device and a driver device. The substrate includes a top surface, a bottom surface and a plurality of vias that extend through the substrate. The high side and low side power devices are disposed on the top surface of the substrate and connected with each other. The driver device is disposed on the bottom surface of the substrate and electrically connected with the high side and low side power devices through the vias to drive the high side and low side power devices in response to a control signal. The distance between the driver device and the high side and low side power devices is determined by the thickness of the substrate such that that a parasitic inductance between the driver device and the high side power device or the low side power device is reduced.

Other example embodiments are discussed herein.

DETAILED DESCRIPTION

Figure 1:
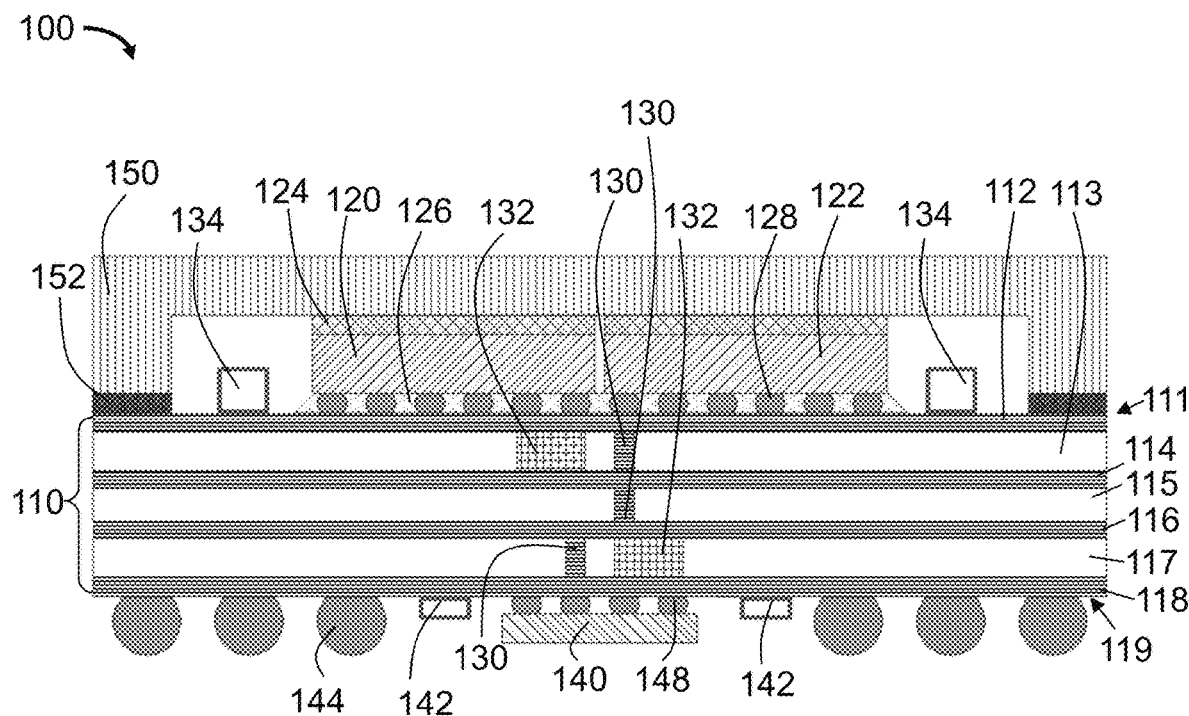
FIG. 1 shows a side view of a power device package in accordance with an example embodiment.

Example embodiments relate to a power device package that includes power devices and a driver device vertically stacked beneath the power devices in order to reduce parasitic parameters.

Power device packages or power modules convert power from input power source to loads. The power modules are required to have low parasitic parameters in order to achieve high switching speed, low loss and high efficiency.

Compared to conventional Silicon-based metal-oxide-semiconductor field-effect transistors (MOSFETs), Gallium Nitride (GaN) Field Effect Transistors (FETs) operate much faster and have higher switching speeds in the smallest possible volume, reducing the size and weight of power modules. However, these high-performance GaN transistors need an optimized gate driver to reach their performance potential.

Conventionally, the gate drivers are disposed on the substrate of the power module in a side-by-side relationship with the transistors, in a planar layout. An effective driver charges and discharges gate capacitance and is required to have low propagation delay to allow fast signals. However, the planer layout induces gate loop and parasitic inductance between the gate driver and the transistors, limiting the switching speed of the power module and causing large overshoot and ringing problems at the output of the power module.

Example embodiments solve these problems by including a driver device vertically stacked beneath the power devices to reduce parasitic parameters. An example embodiment includes a power module or power device package having a substrate, a high side power device, a low side power device and a driver device or driver integrated circuit (IC). The substrate includes a top surface, a bottom surface and a plurality of vias that extend through the substrate. For example, the high side and low side power devices are GaN FETs disposed on the top surface of the substrate and connected with each other. The driver device is disposed on the bottom surface of the substrate and electrically connected with the high side and low side power devices through the vias to drive the high side and low side power devices in response to a control signal. The distance between the driver device and the high side and low side power devices is determined by the thickness of the substrate such that that a parasitic inductance between the driver device and the high side power device or the low side power device is reduced.

In one example embodiment, a plurality of passive devices including resistors, capacitors, and inductors are disposed inside the substrate to save space on the surfaces on the substrate. The passive devices are electrically connected with the driver device to form a gate driver circuit to drive the high side and low side power devices. The gate driver circuit charges and discharges a gate capacitance at a high frequency, and has low propagation delay to allow fast transmission of signals.

In one example embodiment, a temperature sensor or thermistor is embedded inside the substrate of the power device package. The temperature sensor is electrically connected with the driver device to modulate the control signal based on a temperature of the power device package detected by the temperature sensor.

In one example embodiment, the power device package further includes a plurality of solder balls and gate resistors that are bonded on the bottom surface of the substrate. The solder balls function as connectors to connect with external devices. The gate resistors are electrically connected with a gate terminal of the GaN FETs on the top surface through the vias of the substrate.

In another example embodiment, the substrate of the power device package includes certain number of copper layers and ceramic layers each sandwiched between two of the copper layers. The top surface of the substrate is on the top copper layer, and the bottom surface of the substrate is on the bottom copper layer of the substrate. A plurality of vias extend from the top copper layer to a middle copper layer of the substrate, through the ceramic layer in-between. A plurality of vias extend from the middle copper layer to the bottom copper layer of the substrate, through the ceramic layer sandwiched between the middle copper layer and the bottom copper layer. Devices mounted on the bottom copper layer electrically connect with the devices on the top copper layer through the vias in the ceramic layers.

In one example embodiment, a heat spreader is mounted on the top surface of the substrate to encapsulate the GaN FET devices and to dissipate heat from the power module to a heatsink. A thermal interface material is sandwiched between the heat spreader and the GaN FET devices.

In one example embodiment, two or more clamping diodes are disposed between a gate terminal of the GaN FET and a source or drain terminal of the GaN FET for gate over-voltage protection. As one example, the clamping diodes are embedded inside the substrate to save space on the surfaces on the substrate.

In one example embodiment, a thermal sensor is embedded inside the substrate to sense a temperature of the power module and shut down the power devices when the sensed temperature is higher than a threshold value.

FIG. 1 shows a side view of a power device package or power electronic module or electronic device or semiconductor package 100. The power device package 100 includes a ceramic or organic substrate 110, a high side power device 120, a low side power device 122 and a driver device or driver integrated circuit (IC) 140. The substrate 110 includes a top surface 111 and a bottom surface 117. A plurality of vias 130 extend through the substrate 110. The high side and low side power devices are disposed on the top surface 111 of the substrate 110 by mounting on a plurality of solder balls or bumps 128. The driver device 140 is disposed on the bottom surface 117 of the substrate 110 through a plurality of solder balls 148. The driver device can be flip chip mounted on the bottom surface of the substrate. The driver device is electrically connected with the high side and low side power devices through the vias 130 to drive the high side and low side power devices in response to a control signal.

In one example embodiment, a plurality of passive devices 132 are disposed inside the substrate. The passive devices include resistors, capacitors, and inductors that are electrically connected with the driver device 140 to form a gate driver circuit to drive the high side and low side power devices. By way of example, the passive devices are fabricated by using a substrate forming technology, during fabrication of the ceramic layers of the substrate. The driver device 140 is connected to the bottom surface of the substrate through a plurality of solder balls 148. The gate driver circuit charges and discharges a gate capacitance at a high frequency and has low propagation delay to allow fast transmission of signals. The gate driver circuit turns on the high side power device and the low side power device in sequence.

By way of example, the distance between the driver device 140 and the high side and low side power devices is determined by a thickness of the substrate 110. Therefore, parasitic inductance between the driver device and the high side power device or the low side power device is reduced by thinning down the substrate to be less than 1 mm.

By way of example, the high side and low side power devices are FET devices. The high side FET is connected with a first voltage terminal and a phase node. The low side power device is connected with a second voltage terminal and the high side power device though the phase node. The drain of the high side FET is connected with a voltage source. The source terminal of the low side FET is grounded.

The power devices 120 and 122 are mounted on the top surface 111 of the substrate 110 through a plurality of solder balls or bumps 128. Underfilling materials 126 such as silicone gel or epoxy fill the gaps between the bumps 128 to provide locking mechanism to improve the reliability of the package.

In one example embodiment, the power device package 100 further includes a plurality of solder balls 144 and gate resistors 142 that are bonded on the bottom surface 117 of the substrate. The solder balls function as connectors to connect with external devices. The gate resistors 142 are electrically connected with a gate terminal of the high side and low side power devices 120 and 122 through the vias 130.

In one example embodiment, the power device package 100 further includes a plurality of capacitors 134 that are mounted on the top surface 111 of the substrate 110. The capacitors 134 are in electrical communication with the high side and low side power devices 120 and 124. The driver device 140 charges and discharges the capacitors 134 at a high frequency. As one example, the high side and low side power devices are GaN FETs. Each capacitor connects the source of the GaN FET with the drain of the GaN FET.

As one example, the substrate 110 includes three ceramic layers 113, 115 and 117, and four copper layers 112, 114, 116 and 118. The copper layers 112 and 114 are bonded onto top and bottom sides of the ceramic layer 113. The copper layers 114 and 116 are bonded onto top and bottom sides of the ceramic layer 115. The copper layers 116 and 118 are bonded onto top and bottom sides of the ceramic layer 117. The vias 130 are formed in ceramic layer 113, between copper layers 112 and 114 to electrically connect the copper layers in a short path. The vias 130 are also formed in ceramic layer 115 and 117 to electrically connect the copper layers in a short path.

In one example embodiment, a heat spreader 150 is mounted on the top surface 111 of the substrate 110 through a lid attach 152. The heat spreader encapsulates the high side and low side power devices and other electronic components. A thermal interface material 124 is sandwiched between the heat spreader 150 and the high side and low side power devices 120 and 122, such that heat generated by the power devices 120 and 122 is dissipated to the heat spreader and further to a heatsink that contacts the heat spreader.

Figure 2:
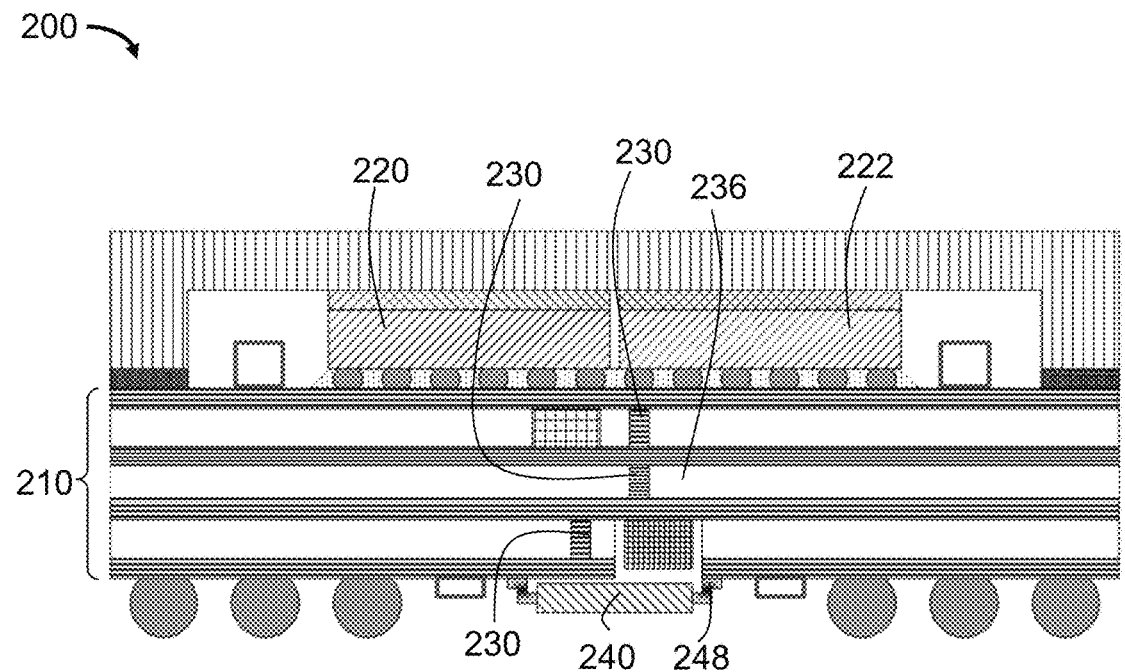
FIG. 2 shows a side view of a power device package in accordance with another example embodiment.

FIG. 2 shows a side view of a power device package or power electronic module or electronic device or semiconductor package 200.

The power device package 200 includes a substrate 210, a high side power device 220, a low side power device 222 and a driver device or driver integrated circuit (IC) 240. The high side and low side power devices 220 and 222 are disposed on the top surface of the substrate 210. The driver device 240 is disposed on the bottom surface of the substrate 210. The driver device 240 is electrically connected with the high side and low side power devices 220 and 222 through the vias 230.

The power device package 200 is the same or similar as the power device package 100 disclosed in FIG. 1. As one difference, a temperature sensor or thermal sensor or thermistor 236 is embedded inside the substrate 210 and electrically connected with the driver device 240 to modulate the control signal based on a temperature detected by the temperature sensor 236. The thermal sensor can shut down the power devices when the sensed temperature is higher than a threshold value. The driver device 240 is connected to the bottom surface of the substrate 210 through a plurality of solder balls or through conductive traces 248 that are printed on the bottom surface of the substrate 210.

Figure 3:
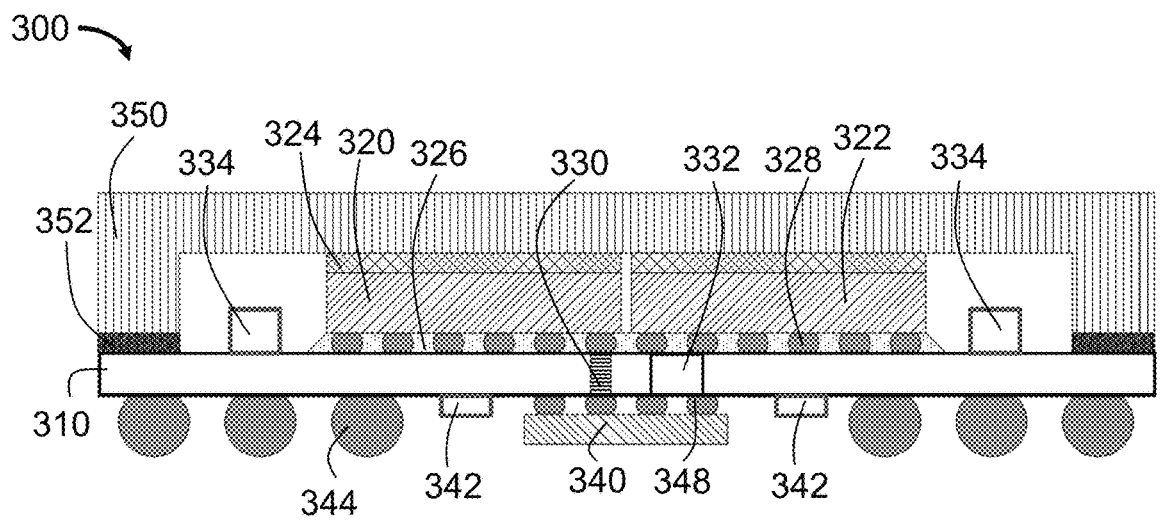
FIG. 3 shows a side view of a power device package in accordance with another example embodiment.

FIG. 3 shows a side view of a power device package or power electronic module or electronic device or semiconductor package 300.

The power device package 300 includes a substrate 310, a first power device 320, a second power device 322 and a driver device or driver integrated circuit (IC) 340. The power devices 320 and 322 are disposed on the top surface of the substrate 310. The driver device 340 is disposed on the bottom surface of the substrate 310, vertically stacked beneath the power devices.

One or more vias 330 extend through the substrate 310 from the top surface to the bottom surface of the substrate. The first and second power devices are mounted on a plurality of solder balls or bumps 328. The driver device 340 is disposed on the bottom surface of the substrate 310 through a plurality of solder balls 348 and is electrically connected with the power devices through the vias 330 to drive the power devices in response to a control signal.

In one example embodiment, a plurality of passive devices 332 are disposed inside the substrate 310. The passive devices include resistors, capacitors, and inductors that are electrically connected with the driver device 340 to form a gate driver circuit to drive the first and second power devices. A plurality of gate capacitors 334 are mounted on the top surface of the substrate and are electrically connected with the power devices 320 and 322. The gate driver circuit charges and discharges the gate capacitors 334 at a high frequency and has low propagation delay to allow fast transmission of signals. The gate driver circuit turns on the first power device 320 and the second power device 322 in sequence.

By way of example, the distance between the driver device 340 and the power devices is determined by a thickness of the substrate 310. Therefore, parasitic inductance between the driver device and the power devices is reduced by thinning down the substrate to be less than 1 mm.

By way of example, the power devices are GaN FET devices. The first GaN FET 320 is connected with a first voltage terminal and a phase node. The second GaN FET 322 is connected with a second voltage terminal and the first GaN FET though the phase node. The drain of the first GaN FET is connected with a voltage source. The source terminal of the second GaN FET is grounded.

The power devices 320 and 322 are mounted on the top surface of the substrate 310 through a plurality of solder balls or bumps 328. Underfilling materials 326 such as silicone gel or epoxy fill the gaps between the bumps 328 to provide locking mechanism and improve the reliability of the package.

In one example embodiment, the power device package 300 further includes a plurality of solder balls 344 and gate resistors 342 that are bonded on the bottom surface of the substrate. The solder balls function as connectors to connect with external devices. The gate resistors 342 are electrically connected with a gate terminal of the power devices 320 and 322 through the vias 330.

In one example embodiment, a heat spreader 350 is mounted on the top surface of the substrate 310 through a lid attach 352. The heat spreader encapsulates the power devices and other electronic components. A thermal interface material 324 is sandwiched between the heat spreader 350 and the power devices 320 and 322, such that heat generated by the power devices is dissipated to the heat spreader and further to a heatsink that contacts the heat spreader.

As discussed herein, the power device package with the driver device vertically stacked below the power devices reduces loop parasitic inductances and the form factor of the package. The power device package operates at high speed and achieves high efficiency power conversion. The power device package also has low junction-case thermal resistance ($R_{JC}$), which improves interconnect reliability.

Figure 4:
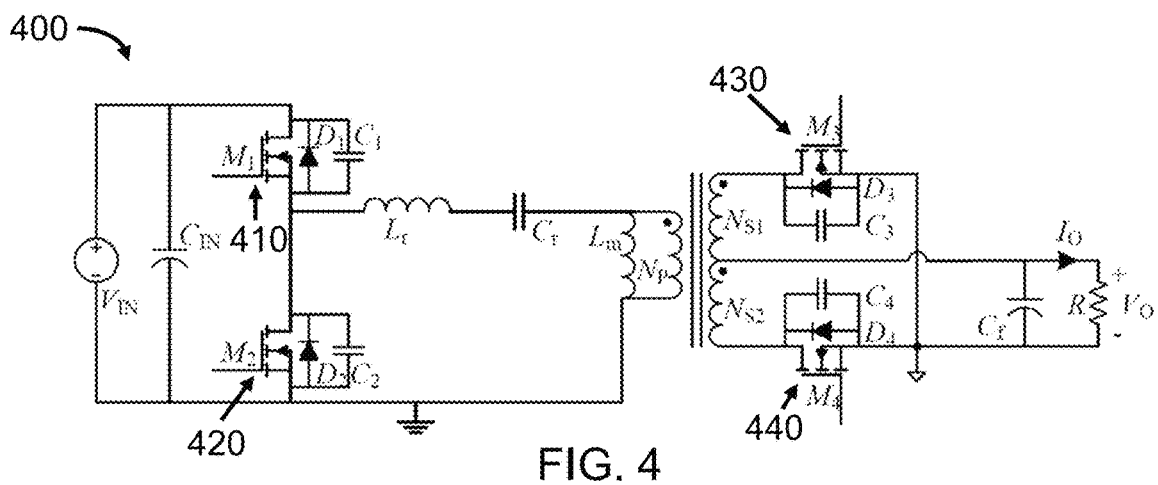
FIG. 4 shows a diagram of a resonant converter circuit package in accordance with an example embodiment.

FIG. 4 shows a diagram of a resonant converter circuit 400 in accordance with an example embodiment.

By way of example, the resonant converter circuit includes FETs 410, 420, 430 and 440.

By way of example, FETs 410 and 420 form a main switch stage as a primary side of the resonant converter circuit 400. The source of the FET 410 is connected with the drain of FET 420, in a half-bridge configuration. The body and source of FET 420 are grounded.

FETs 430 and 440 form a synchronous rectifier stage as a secondary side of the resonant converter circuit 400. The source of the FET 430 is connected with the source of FET 440, in a parallel configuration.

In one example embodiment, FETs 410 and 420, together with other electronic components and driver devices are housed in a power device package, as described in FIG. 1, 2 or 3. FETs 430 and 440, together with other electronic components and driver devices are housed in another power device package, as described in FIG. 1, 2 or 3. Various converter topologies such as half bridge and/or full bridge can be applied.

Figure 5:
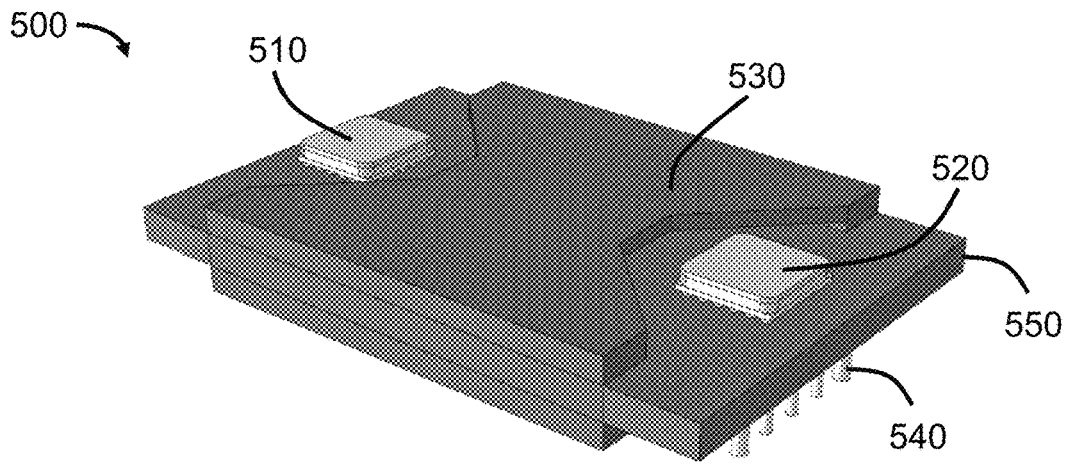
FIG. 5 shows a power converter module with two power device packages in accordance with an example embodiment.

FIG. 5 shows a power converter module 500 with two power device packages 510 and 520 in accordance with an example embodiment.

By way of example, power device packages 510 and 520 are mounted on a base 550. The power device packages 510 or 520 include power devices and driver devices vertically stacked below the power devices to save space, similar as the power device packages disclosed in FIG. 1, 2 or 3.

In one example embodiment and with reference to FIG. 4, power device package 510 houses the FETs 410 and 420 and their drivers. Power device package 520 houses the FETs 430 and 440 and their drivers.

A magnetic core 530 is mounted on the base 530, between power device package 510 and the power device package 520. The magnetic core increases the strength of magnetic field of an electromagnetic coil of the power converter module, leading to a higher efficiency of the power converter module 500. Due to the small size of the power device packages, a large area of the power converter module 500 is available for the magnetic core 530, which increases the strength of magnetic field by a factor of several hundred times. The power converter module 500 has low parasitic effect, and can operate at a high frequency with high output power.

As shown in FIG. 5, the power converter module 500 also includes metal pins 540 that are soldered or attached to the base 550 to form electrical connections to external devices.

Figure 6:
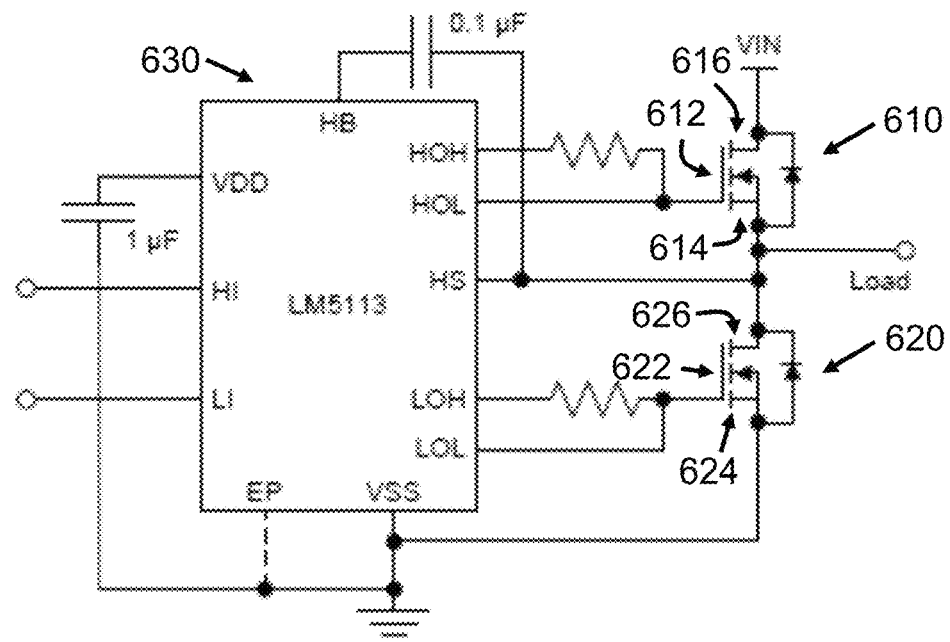
FIG. 6 shows a circuit diagram in half-bridge configuration in accordance with an example embodiment.

FIG. 6 shows a circuit diagram 600 in half-bridge configuration in accordance with an example embodiment.

In one example embodiment, the circuit diagram 600 is a power converter housed in a power device package, as described in FIG. 1, 2 or 3. The power converter includes a high side switch 610 and a low side switch 620 connected with each other in a half-bridge configuration. For example, the high side and low side switches are metal-oxide-semiconductor field-effect transistors (MOSFETs) or GaN FETs. The source 614 of the switch 610 is connected with the drain 626 of the switch 620. The drain 616 of the switch 610 is connected with an input terminal VIN. The source 624 of the switch 620 is grounded. The load is connected with the drain 626 of the switch 620 and the source 614 of the switch 610.

The power converter circuit also includes a driver 630 that provides driving signals to the gate 612 of the high side switch 610 and the gate 622 of the low side switch 620.

Figure 7:
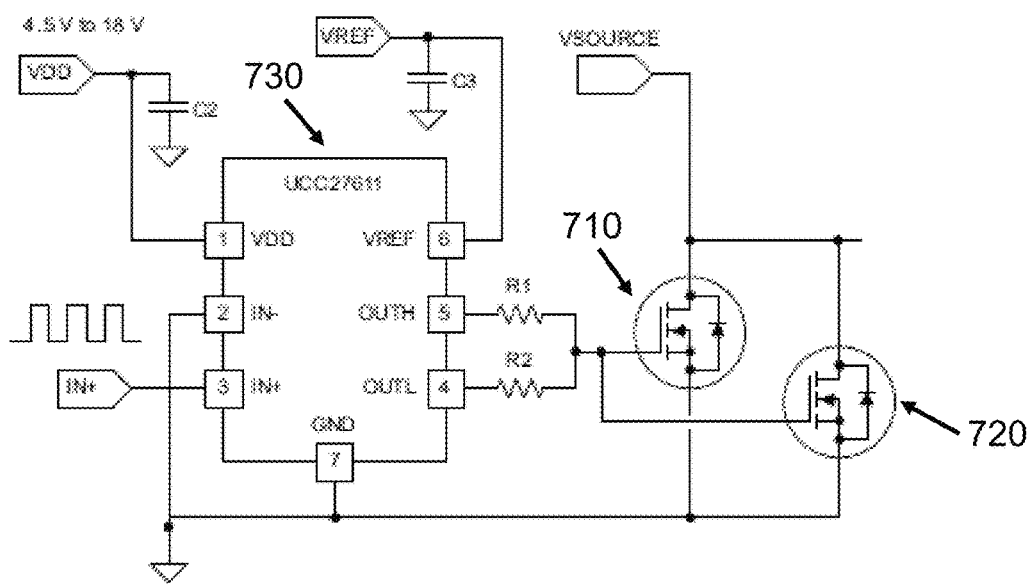
FIG. 7 shows a circuit diagram in parallel configuration in accordance with an example embodiment.

FIG. 7 shows a circuit diagram 700 in parallel configuration in accordance with an example embodiment.

In one example embodiment, the electronic components in the circuit diagram 700 are housed in a power device package, as described in FIG. 1, 2 or 3. FET 710 and FET 720 are connected with each other in parallel and mounted on a top surface of the substrate of the power device package. The driver 730 is disposed on the bottom surface of the substrate and is electrically connected with the FETS on the top surface through vias in the substrate to provide driving signals to the FETs.

Figure 8:
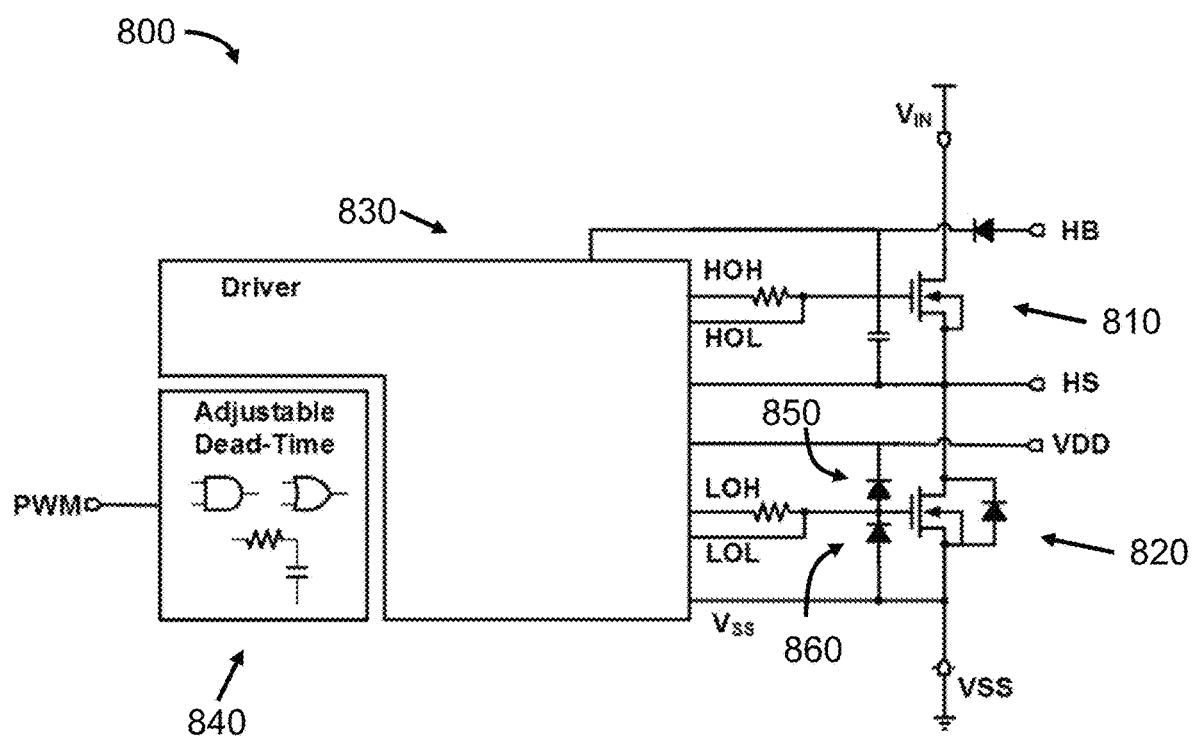
FIG. 8 shows a self-protection and adjustable circuit in accordance with an example embodiment.

FIG. 8 shows a self-protection and adjustable circuit 800 in accordance with an example embodiment.

In one example embodiment, the electronic components of the self-protection and adjustable circuit 800 are housed in a power device package, as described in FIG. 1, 2 or 3. The self-protection and adjustable circuit 800 includes two FETs 810 and 820 that are connected with each other. The source of FET 810 is connected with the drain of FET 820. A driver 830 provides driving signals to the FETs. The driver 830 further includes a component 840 that adjusts the dead time of the self-protection and adjustable circuit 800. The driver 830 operates to bias the two FETs in response to a control signal, for example, a pulse width modulation (PWM) signal, coupled to the input of the driver 830.

In one example embodiment, two clamping diodes 850 and 860 are connected with FET 820. As one example, the clamping diodes are Schottky Barrier Diodes (SBDs). The clamping diode 850 connects the gate terminal of FET 820 with the drain terminal of FET 820. Clamping diode 860 connects the gate terminal of FET 820 with the source terminal of FET 820. As one example, the clamping diodes 850 and 860 are embedded inside the substrate of the power device package, as described in FIG. 1, 2 or 3.

The clamping diodes protect the gate of the FET 820 from voltage overshoot. For example, the voltage between the gate and source of FET 820 is controlled in a range of 5V to 6V.

By including both component 840 that adjusts the dead time and the clamping diodes, the switching loss can be reduce by 40%, which leads to an improvement of power conversion efficiency by 2% in one example. The clamping diodes also reduce the turn off time of the transistors, thereby improving the speed of the circuit.

Figure 9:
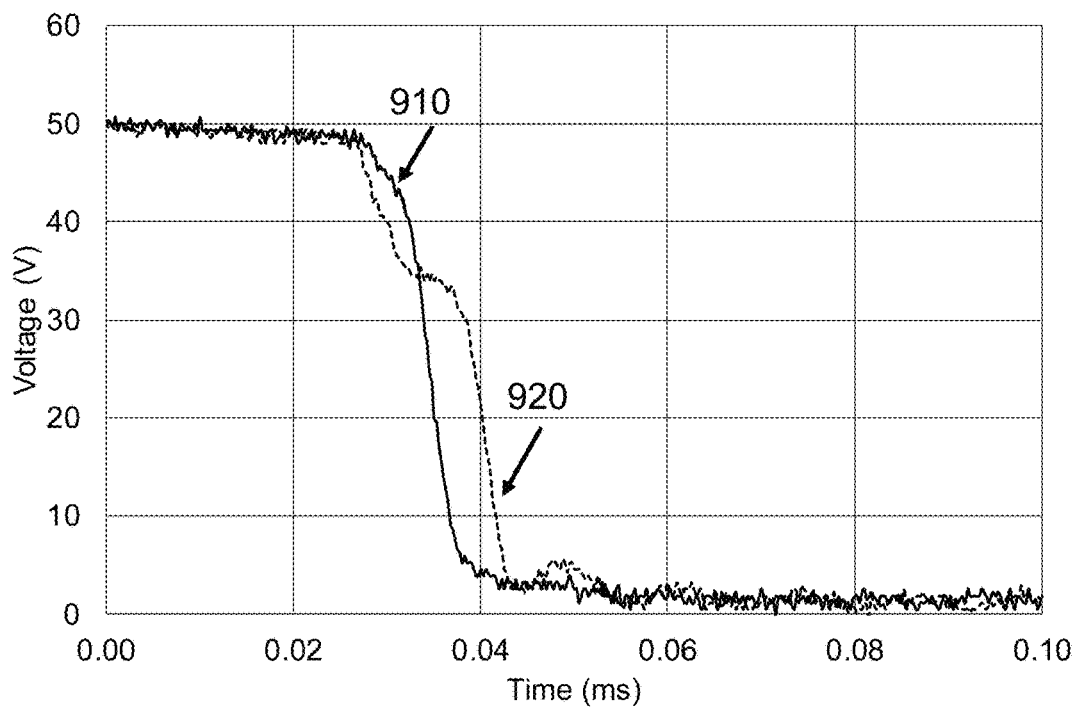
FIG. 9 shows a graph of switch-on performance of two power converters in accordance with an example embodiment.

FIG. 9 shows a graph of switch-on performance of two power converters in accordance with an example embodiment. The X-axis shows time in milliseconds (ms), and the Y-axis shows the voltage between the drain and the source of a FET of the converter.

By way of example, curve 910 shows the measured voltage between the drain and the source of a FET of a first converter, when the FET is switched on by applying a voltage to the gate of the FET. The first converter includes FET switches and drivers vertically stacked below the switches, similar as the power device packages disclosed in FIG. 1, 2 or 3. Curve 920 shows the measured voltage between the drain and the source of a FET of a second converter, when the FET is switched on by applying a voltage to the gate of the FET. The second converter includes FET switches and drivers disposed next to the switches in a side-by-side relationship, in a conventional planar configuration.

As show in FIG. 9, the first converter with the vertical configuration has faster turn on speed than the second converter with the conventional planar configuration.

Figure 10:
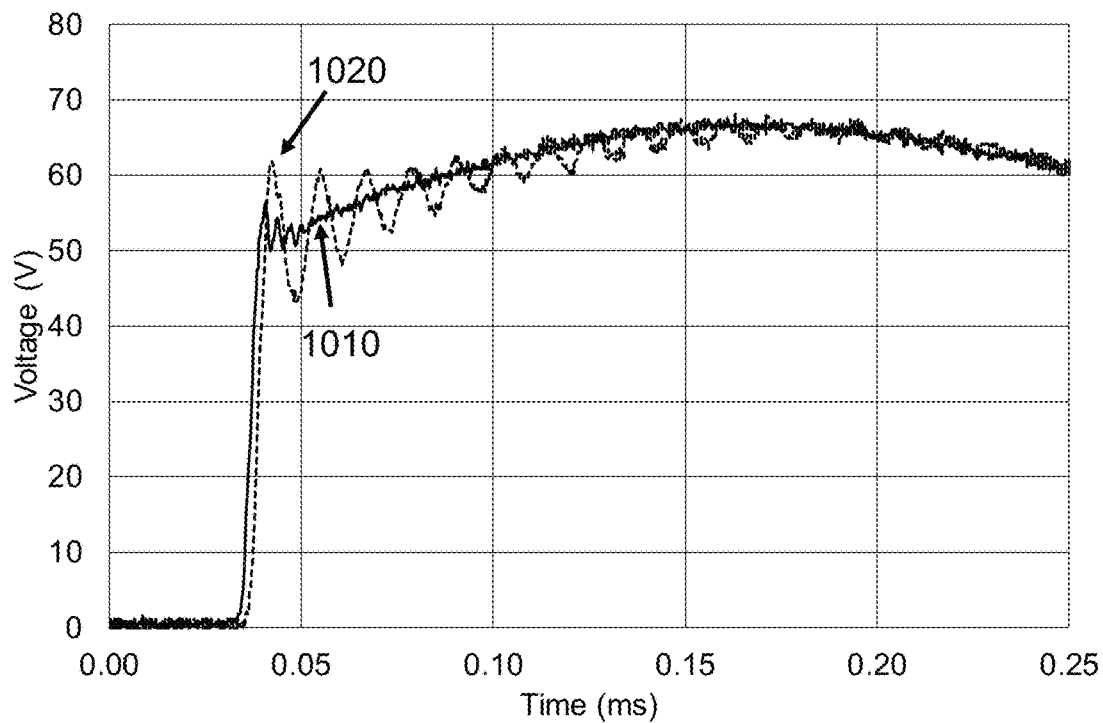
FIG. 10 shows a graph of switch-off performance of two power converters in accordance with an example embodiment.

FIG. 10 shows a graph of switch-off performance of two power converters in accordance with an example embodiment. The X-axis shows time in milliseconds (ms), and the Y-axis shows the voltage between the drain and the source of a FET of the converter.

By way of example, curve 1010 shows the measured voltage between the drain and the source of a FET of a first converter, when the FET is switched off by reducing a voltage on the gate of the FET. The first converter includes FET switches and drivers vertically stacked below the switches, similar as the power device packages disclosed in FIG. 1, 2 or 3. Curve 1020 shows the measured voltage between the drain and the source of a FET of a second converter, when the FET is switched off by reducing a voltage on the gate of the FET. The second converter includes FET switches and drivers disposed next to the switches in a side-by-side relationship, in a conventional planar configuration.

As show in FIG. 10, the second converter has a swinging or ringing problem and a large overshoot voltage. The overshoot voltage percentage of the second converter with the conventional planar configuration is 23.6%, while the overshoot voltage percentage of the first converter with the vertical configuration is 9.5%. Therefore, the first converter with the vertical configuration improves the overshoot performance by about 60%.

The methods and apparatus in accordance with example embodiments are provided as examples, and examples from one method or apparatus should not be construed to limit examples from another method or apparatus. Further, methods and apparatus discussed within different figures can be added to or exchanged with methods and apparatus in other figures. Further yet, specific numerical data values (such as specific quantities, numbers, categories, etc.) or other specific information should be interpreted as illustrative for discussing example embodiments.

As used herein, a "power device package" or a "power module" is an electronic package or electronic module that contains power devices. Examples of power devices include, but are not limited to, metal-oxide semiconductor field-effect transistor (MOSFET), field-effect transistor (FET), diode, insulated gate bipolar transistor (IGBT), bipolar junction transistor (BJT), thyristor, gate turn-off thyristor (GTO) and junction gate field-effect transistor (JFET).

As used herein, a "high side power device" is a power device with a drain terminal connected to a voltage source and with a source terminal connected to a drain terminal of another device.

As used herein, a "low side power device" is a power device with a drain terminal connected to a source terminal of another device and with a source terminal connected to ground.

As used herein, a "clamping diode" is a diode used to limit the peak voltage on a line to a predetermined maximum voltage.

As used herein, "electronic components" are electronic devices that have a number of electrical terminals connected with one another to create an electronic circuit with a particular function. Examples of electronic components include, but are not limited to, diodes, transistors, resistors, capacitors, inductive devices, sensors and detectors.

As used herein, "parasitic inductance" is unwanted or undesired inductance that a circuit element or electrical component has.

As used herein, a "solder ball" is a solder material having a ball shape, a cube shape, or another shape and includes metals and metal alloys.

As used herein, a "conductive trace" or a "conductive layer" is a trace or layer that is formed of a conductive material that allows the flow of electricity. Examples of a conductive material include, but are not limited to, solder alloys, copper, silver, gold, aluminum, zinc, nickel, brass, and other conductive material (such as other metals, graphite, polymers, and semiconductors).

What is claimed is:

1. A power device package, comprising:
   a substrate having a top surface, a bottom surface and a plurality of vias that extend through the substrate, wherein the substrate includes a first ceramic layer disposed between a first conductive layer and a second conductive layer, a second ceramic layer disposed between the second conductive layer and a third conductive layer, and a third ceramic layer disposed between the third conductive layer and a fourth conductive layer, and wherein the first conductive layer is proximate to the top surface and the fourth conductive layer is proximate to the bottom surface;
   a high side power device disposed on the top surface of the substrate and connected with a first voltage terminal and a phase node, wherein the high side power device comprises a first Gallium Nitride (GaN) field effect transistor (FET);
   a low side power device disposed on the top surface of the substrate and connected with a second voltage terminal and the high side power device through the phase node, wherein the low side power device comprises a second GaN FET;
   a first clamping diode configured to electrically connect gate and source terminals of the low side power device, wherein the first clamping diode is embedded within the substrate between the first conductive layer and the fourth conductive layer;
   a driver device disposed on the bottom surface of the substrate and electrically connected with the high side and low side power devices through the plurality of vias to drive the high side and low side power devices in response to a control signal; and
   a first gate resistor and a second gate resistor disposed on the bottom surface of the substrate, wherein the first gate resistor is configured to electrically connect with a gate terminal of the low side power device through the plurality of vias and the second gate resistor is configured to electrically connect with a gate terminal of the high side power device through the plurality of vias,
   wherein a distance between the driver device and the high side and low side power devices is determined by a thickness of the substrate such that a parasitic inductance between the driver device and the high side power device or the low side power device is reduced,
   wherein at least a first one of the plurality of vias is formed between the first and second conductive layers to electrically connect the second conductive layer with the first conductive layer, wherein at least a second one of the plurality of vias is formed between the second and third conductive layers to electrically connect the third conductive layer with the second conductive layer, and wherein at least a third one of the plurality of vias is formed between the third and fourth conductive layers to electrically connect the fourth conductive layer with the third conductive layer.

2. The power device package of claim 1 further comprising:
   a plurality of resistors, capacitors, and inductors that are disposed inside the substrate and that are electrically connected with the driver device to form a gate driver circuit to drive the high side and low side power devices, wherein the driver device is connected to traces on the bottom surface of the substrate.

3. The power device package of claim 1 further comprising:
   a temperature sensor that is embedded inside the substrate and electrically connected with the driver device to modulate the control signal based on a temperature of the power device package detected by the temperature sensor.

4. The power device package of claim 1, further comprising a second clamping diode embedded within the substrate between the first conductive layer and the fourth conductive layer, the second clamping diode is configured to electrically connect gate and drain terminals of the high side power device.

5. The power device package of claim 1, wherein the high side power device and the low side power device are Gallium Nitride FETs, and wherein the power device package further comprises:
   a plurality of solder balls that are bonded on the bottom surface of the substrate and that function as connectors to connect with external devices; and
   a plurality of gate resistors that are on the bottom surface of the substrate and that are electrically connected with a gate terminal of the Gallium Nitride FETs through the vias of the substrate,
   wherein the driver device is disposed on one or more of the solder balls of the bottom surface of the substrate.

6. An electronic device, comprising:
   a substrate having a top surface, a bottom surface and a plurality of vias;
   a first Gallium Nitride (GaN) Field Effect Transistor (FET) device disposed on the top surface of the substrate and connected to a first voltage terminal;
   a second GaN FET device disposed on the top surface of the substrate and connected to the first GaN FET and a second voltage terminal;
   a first clamping diode configured to electrically connect gate and source terminals of the second GaN FET device, wherein the first clamping diode is embedded within the substrate between the top surface and the bottom surface;

a driver integrated circuit (IC) disposed on the bottom surface of the substrate beneath the first and second GaN FET devices and configured to electrically connect with gates of the first and second GaN FET devices through the plurality of vias to send a control signal to the gates such that a gate loop distance between the driver IC and the first and second GaN FET devices is minimized; and wherein the substrate includes a first ceramic layer disposed between a first conductive layer and a second conductive layer, a second ceramic layer disposed between the second conductive layer and a third conductive layer, and a third ceramic layer disposed between the third conductive layer and a fourth conductive layer, wherein at least a first one of the plurality of vias is formed between the first and second conductive layers to electrically connect the second conductive layer with the first conductive layer, wherein at least a second one of the plurality of vias is formed between the second and third conductive layers to electrically connect the third conductive layer with the second conductive layer, and wherein at least a third one of the plurality of vias is formed between the third and fourth conductive layers to electrically connect the fourth conductive layer with the third conductive layer.

7. The electronic device of claim 6 further comprising:
a plurality of passive devices including resistors, capacitors, and inductors that are embedded inside the substrate and are electrically connected with the driver IC to form a driver circuit to drive the gates of the first and second GaN FET devices.

8. The electronic device of claim 6 further comprising:
a thermistor that is embedded inside the substrate and electrically connected with the driver IC to modulate the control signal based on a temperature of the electronic device detected by the thermistor.

9. The electronic device of claim 6 further comprising:
a second clamping diode embedded within the substrate between the top surface and the bottom surface, the second clamping diode is configured to electrically connect gate and drain terminals of the first GaN FET device.

10. The electronic device of claim 6 further comprising:
a plurality of gate resistors on the bottom surface of the substrate that are electrically connected with the gate of the first and second FET devices through the vias,
wherein the driver IC is disposed on one or more solder balls of the bottom surface of the substrate.

11. The electronic device of claim 6 further comprising:
a plurality of capacitors that are mounted on the top surface of the substrate,
wherein the capacitors are in electrical communication with the first and second GaN FET devices on the top surface of the substrate.

12. The electronic device of claim 6 further comprising:
a heat spreader that is mounted on the top surface of the substrate to encapsulate the first and second GaN FET devices and to dissipate heat from the electronic device to a heatsink,
wherein a thermal interface material is sandwiched between the heat spreader and the first and second GaN FET devices.

13. The power device package of claim 1 further comprising an adjustable dead time circuit embedded within the substrate between the top surface and the bottom surface.

14. The electronic device of claim 6 further comprising an adjustable dead time circuit embedded within the substrate between the top surface and the bottom surface.

* * * * *